US008401092B1

(12) United States Patent
Liu et al.

(10) Patent No.: US 8,401,092 B1
(45) Date of Patent: Mar. 19, 2013

(54) MULTI-REFERENCE CLOCK SYNCHRONIZATION TECHNIQUES

(75) Inventors: Binfan Liu, Livermore, CA (US); Junyi Xu, Fremont, CA (US); Weimin Zhang, San Jose, CA (US)

(73) Assignee: Broadlogic Network Technologies Inc., San Jose, CA (US)

( * ) Notice: Subject to any disclaimer, the term of this patent is extended or adjusted under 35 U.S.C. 154(b) by 281 days.

(21) Appl. No.: 12/848,073

(22) Filed: Jul. 30, 2010

(51) Int. Cl.
*H04B 3/00* (2006.01)
(52) U.S. Cl. .................................................. 375/257
(58) Field of Classification Search .............. 375/257, 375/285, 354, 356; 370/503
See application file for complete search history.

(56) References Cited

U.S. PATENT DOCUMENTS

| 6,711,360 | B1 * | 3/2004 | Wu ............................... 398/182 |
| 7,089,014 | B2 * | 8/2006 | Brown et al. ................. 455/450 |
| 8,009,719 | B2 * | 8/2011 | Shao et al. .................... 375/130 |
| 8,179,883 | B2 * | 5/2012 | Bao et al. ...................... 370/352 |
| 2008/0095155 | A1 * | 4/2008 | Danzig ......................... 370/389 |
| 2008/0134262 | A1 * | 6/2008 | Jung et al. .................... 725/109 |
| 2010/0002719 | A1 * | 1/2010 | Sowinski et al. ............. 370/458 |

* cited by examiner

*Primary Examiner* — Khanh C Tran
(74) *Attorney, Agent, or Firm* — Sterne, Kessler, Goldstein & Fox PLLC (57) ABSTRACT

Efficient synchronization techniques that support multiple reference clocks in an EQAM device. Consider a plurality of different modulators in the EQAM device receiving data from a corresponding plurality of different sources having corresponding different timing references (i.e., different source reference clocks). To accommodate this, the modulators all operate using a common system clock, and each modulator is provided with a phase synchronizer. The phase synchronizer synchronizes the modulated symbol phases to the corresponding reference clock.

28 Claims, 6 Drawing Sheets

MULTI-REFERENCE CLOCK SYNCHRONIZATION TECHNIQUES

BACKGROUND OF THE INVENTION

The present invention relates generally to broadcast systems, and more particularly to systems and methods for synchronizing broadcast transmissions.

A cable modem termination system ("CMTS") refers to equipment typically found in a cable company's headend. A CMTS can be used to provide high speed data services, such as cable internet or Voice over IP (VoIP), to cable subscribers. In a typical configuration, the CMTS routes data traffic between Ethernet interfaces (such as an IP network) and RF interfaces (e.g., HFC cable). HFC is an acronym for hybrid fiber/coaxial, and an HFC network is a communications network that uses a combination of coaxial cable and fiber optic connections.

The modular CMTS ("M-CMTS") architecture separates a conventional CMTS into two parts, referred to as the CMTS core (or the M-CMTS core) and the EQAM. The CMTS core provides such functionality as IP networking, MAC timing and framing, and service flow management. The EQAM, which stands for edge quadrature amplitude modulation, includes physical layer (PHY) circuitry that provides such functionality as modulation and frequency up-conversion for transmission of data packets over HFC cables. While the modulators (EQAMs) can be part of the cable provider headend, they may also be at a remote facility.

In a typical M-CMTS implementation, the M-CMTS core communicates with the EQAM over a regional area network (e.g., a packet-based network such as an IP network), and a DOCSIS® timing interface server (DTI server) maintains a consistent timing reference among the data sources, the M-CMTS core, and the EQAM(s). The EQAM(s) synchronize their system clocks to the DTI server and generate modulated symbols to the HFC network.

Although IP networks potentially provide advantages in view of their lower cost, their packet-based nature means that no data clocks are delivered, the data crossing IP networks have varying delay and jitter, and data may be lost. With synchronizing to a reference clock, the EQAMs are able to correct any timing delay and jitter introduced by IP networks.

Although the present invention relates primarily to downstream transmissions, there will be brief references to the upstream communications carried out, for example, by cable modems on the cable network. For example, synchronization such as mentioned above remains essential to cable networks because the physical transmission medium (in this case coaxial cable) is shared by all cable modems on a network. The M-CMTS core synchronizes the EQAM devices to schedule, correct, and insert MPEG timestamps for video. A cable modem receives its synchronization from an EQAM device so that it is synchronized to other cable modems to properly transmit to the upstream receiver. This process ensures that all cable modems sharing the HFC cable and CMTS do not interfere with each other.

As increasing demands on IP-based services from hybrid networks for rich multimedia content, such as high-definition VOD, IPTV, and gaming, the data bandwidth will quickly exceed the M-CMTS core capacity to synchronize the contents to the DTI server. Accordingly, rich multimedia contents may be tunneled directly to the EQAMs (bypassing the M-CMTS core). However, this requires that the EQAMs deliver modulated contents to customers' CPE, but the QAM channels are not synchronized to traditional DOCSIS channels. Furthermore, many data source servers may generate their contents with respect to reference clocks independent of the DTI servers.

SUMMARY OF THE INVENTION

Embodiments of the present invention recognize and address the problem that bypassing the M-CMTS core requires the EQAMs synchronize multiple reference clocks in order to receive contents from multiple sources, which requires recovering multiple clocks, and greatly complicates the system design.

Embodiments of the present invention can be used in systems where multiple source (data or media content) servers communicate with modulators over an interface, such a packet-based interface, where timing and/or phase information is lost in the transmission. Where the frequency is fixed, the terms "timing information" and "phase information" can be used interchangeably since one can be derived from the other. For consistency, the term "phase information" and similar terms will be used.

Embodiments of the present invention provide economical synchronization techniques that support multiple reference clocks in an EQAM device. Consider a plurality of different modulators in the EQAM device receiving data from a corresponding plurality of different sources having corresponding different timing references (i.e., different source reference clocks). To accommodate this, the modulators all operate using a common system clock, and each modulator is provided with a phase synchronizer. The phase synchronizer synchronizes the modulated symbol phases to the corresponding reference clock.

According to an aspect of the present invention, techniques are provided for synchronizing symbol phases to multiple independent reference clocks. Modulators modulate the symbols aligned to synchronized phases while all the modulators operate at the same system clock.

In this aspect of the invention, apparatus for use at a cable provider facility includes first and second modulators and first and second phase synchronizers coupled to the first and second modulators, respectively. The first and second modulators receive data from respective first and second data sources and generate respective first and second symbol streams. The first and second data sources are characterized by respective independent first and second source reference clocks.

The apparatus includes an input for receiving a system clock that is independent of the first and second reference clocks and is characterized by a system clock period. Each phase synchronizer has a source reference clock input, a system clock input, and an output coupled to the respective modulator. The phase synchronizers and the modulators operate in response to the system clock. Each phase synchronizer responds to signals at its respective source reference clock and system clock inputs to provide symbol phase information to the respective modulator to synchronize the respective modulator to the reference clock while the modulator operates in response to the system clock.

In specific embodiments, each phase synchronizer comprises an edge detector, a phase-locked loop (PLL), and a phase accumulator, each of which operates in response to the system clock. The edge detector generates, in response to a detected designated edge of the source reference clock, a difference relative to a succeeding designated edge of the system clock (e.g., the immediately following rising edge), and communicates the difference to the PLL. The PLL and the phase accumulator are connected in a feedback loop and provide information to the modulator.

The succeeding designated edge can be the next rising edge, the next falling edge, or in some embodiments, the next edge regardless of whether it is a rising edge or a falling edge. For implementations where the difference is generated by the edge detector based on a particular edge of the system clock that occurs only once every system clock cycle (only rising edges or falling edges), the difference is restricted to values within one system clock period, thereby providing a phase detection accuracy corresponding to the system clock period. For implementations where the difference is generated by the edge detector on both rising and falling edges of the system clock, the difference is restricted to values within half a system clock period, thereby providing a phase detection accuracy corresponding to half the system clock period.

In specific embodiments, each phase synchronizer comprises an edge detector, a phase-locked loop (PLL), and a phase accumulator, each of which operates in response to the system clock. The PLL and the phase accumulator are connected in a feedback loop configuration where the phase synchronizer's output signal, or a signal derived therefrom is M/N adjusted and fed back. The particular way that these elements cooperate differs according to different embodiments.

In a first set of embodiments, the edge detector generates, in response to detected designated edges of the source reference clock, difference signals relative to succeeding designated edges of the system clock, and communicate the difference signals to the PLL. The PLL, in response to the difference signals and to a feedback signal from the phase accumulator, generates phase adjustment signals and communicates the phase adjustment signals to the phase accumulator. The phase accumulator, in response to the phase adjustment signals, generates symbol phase signals and communicates the phase adjustment signals to the PLL as the feedback signal, and also communicates the phase adjustment signals to that phase synchronizer's associated modulator.

In the first set of embodiments, the associated modulator is not provided with a separate symbol clock generator, and the associated modulator, in response to the symbol phase signals, generates partial symbols and outputs the partial symbols at the system clock frequency.

In a second set of embodiments, each modulator is provided with a separate symbol clock generator. The edge detector generates, in response to detected designated edges of the source reference clock, difference signals relative to succeeding designated edges of the system clock, and communicates the difference signals to the PLL.

The PLL, in response to the difference signals and to a feedback signal from the phase accumulator, generates phase adjustment signals and communicates the phase adjustment signals to the symbol clock generator associated with that phase synchronizer's associated modulator. The symbol clock generator generates a symbol clock signal that is communicated to the associated modulator, and further communicates symbol phase signals to the phase accumulator. The phase accumulator, in response to the symbol phase signals, generates the feedback signal, and communicates the feedback signal to the PLL.

According to another aspect of the present invention, techniques are provided for synchronizing the frequency and phase of modulated symbols to a reference clock while sampled at rising and/or falling edges of a clock with higher frequency.

In this aspect of the invention, apparatus for use at a cable provider facility includes first and second modulators and first and second phase synchronizers coupled to the first and second modulators, respectively. The first and second modulators receive data from respective first and second data sources and generate respective first and second symbol streams. The first and second data sources are characterized by respective first and second source reference clocks, which may be independent of each other or may be the same.

The apparatus includes an input for receiving a system clock that is independent of the first and second reference clocks and is characterized by a system clock period. Each phase synchronizer has a source reference clock input, a system clock input, and an output coupled to the respective modulator. The phase synchronizers and the modulators operate in response to the system clock. Each phase synchronizer responds to signals at its respective source reference clock and system clock inputs to provide symbol phase information to the respective modulator to synchronize the respective modulator to the reference clock while the modulator operates in response to the system clock.

Each phase synchronizer comprises an edge detector, a phase-locked loop (PLL), and a phase accumulator, each of which operates in response to the system clock. The edge detector generates, in response to a detected designated edge of the source reference clock, a difference relative to the next succeeding edge of the system clock, including rising and falling edges, so that the difference is restricted to values within half a system clock period, thereby providing a phase detection accuracy corresponding to half the system clock period. The edge detector communicates the difference to the PLL, with the PLL and the phase accumulator being connected in a feedback loop and provide information to the modulator.

According to yet another aspect of the present invention, a method is provided for multiplexing QAM channels, while each channel modulates symbols using its respective ratio of the symbol clock rate to the reference clock rate, where the ratios can be different for at least some of the channels.

In this aspect of the invention, apparatus for use at a cable provider facility includes first and second modulators and first and second phase synchronizers coupled to the first and second modulators, respectively. The first and second modulators receive data from respective first and second data sources and generate respective first and second symbol streams. The first and second data sources are characterized by respective first and second source reference clocks, which may be independent of each other or may be the same.

The apparatus includes an input for receiving a system clock that is independent of the first and second reference clocks and is characterized by a system clock period. Each phase synchronizer has a source reference clock input, a system clock input, and an output coupled to the respective modulator. The phase synchronizers and the modulators operate in response to the system clock. Each phase synchronizer responds to signals at its respective source reference clock and system clock inputs to provide symbol phase information to the respective modulator to synchronize the respective modulator to the reference clock while the modulator operates in response to the system clock.

Each phase synchronizer is configured with a symbol divisor characteristic of a modulation mode of its associated modulator, and the first and second phase synchronizers are configured with different symbol divisors to allow for different modulation modes.

A further understanding of the nature and advantages of the present invention may be realized by reference to the remaining portions of the specification and the drawings, which are intended to be exemplary and not limiting.

DESCRIPTION OF SPECIFIC EMBODIMENTS

Overview of the Problem and Introduction of the Solution

Aspects of the present invention include a recognition of the manner in which the increased bandwidth demands impact the synchronization of the various elements in a cable provider infrastructure.

Figure 1:
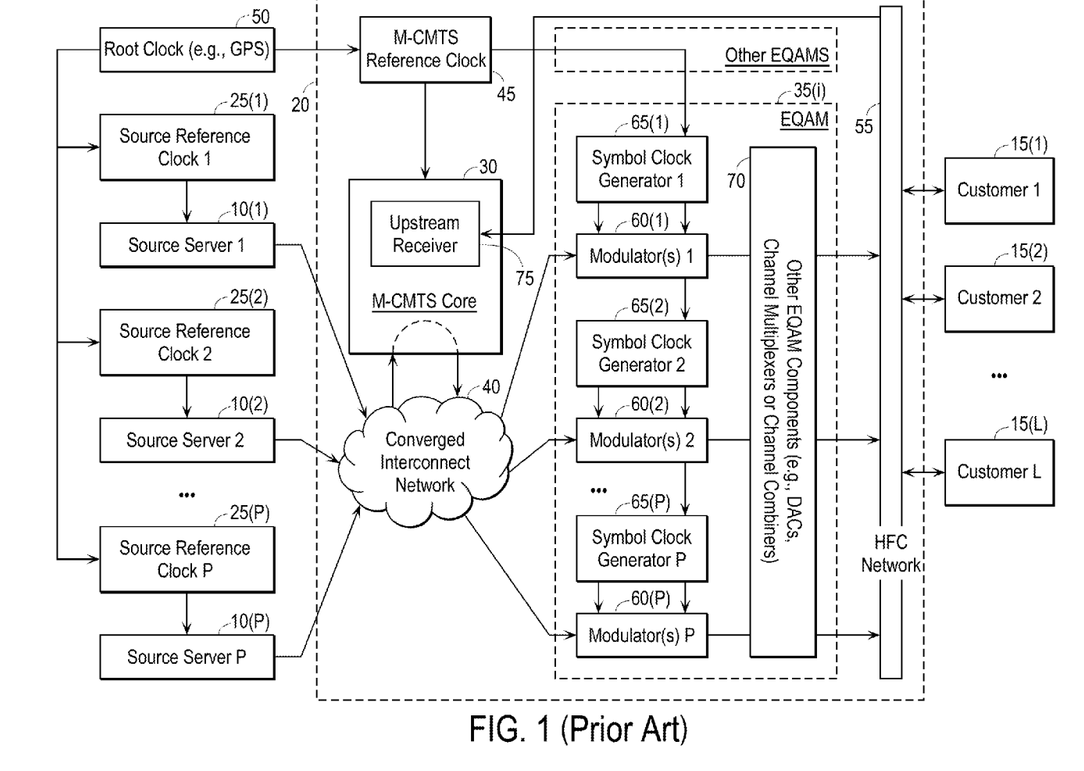
FIG. 1 is a block diagram showing a typical prior art system where multiple data sources communicate with an M-CMTS core and EQAM components over a packet-based interface.

FIG. 1 is a system block diagram showing a traditional system where a plurality of source servers 10(1 ... P) provide respective content to a plurality of customer sites 15(1 ... L) via a cable provider infrastructure 20. The customer sites include customer premises equipment (CPE) that can include cable modems (CMs), game boxes, set-top boxes, digital television sets, and other equipment that is configured to receive signals from, or send signals to, the cable provider. The source servers are in general not under the control of the cable provider, and are provided with respective source reference clocks 25(1 ... P), some of which may be synchronized with each other, but in general need not be.

In general, embodiments of the present invention are not concerned with any of the details of cable modems and set-top boxes sending signals to the cable provider. These are mentioned for completeness, and it is noted that the synchronization techniques of the present invention are entirely consistent with any upstream functionality provided by the cable provider infrastructure.

References to pluralities of elements will often use the suffix "(1 ... P)" on a reference numeral, possibly using a different letter to make explicit the fact that some pluralities normally have different numbers of members. For example, the number of possible data sources will almost always be smaller than the number of customer sites. Unless the context dictates otherwise, the use of the same letter (for example "P") for two pluralities should not be taken as an indication of a one-to-one correspondence between the elements in the pluralities. Moreover, the use of a (1 ... P) suffix should not be taken to mean that the particular plurality so denoted constitutes all such elements.

The cable provider infrastructure includes an M-CMTS core 30 and one or more EQAM components (a single one of which, EQAM 35($i$) is shown, but the EQAMs will sometimes be referred to as EQAMs 35(1 ... P)). The infrastructure also includes a converged interconnect network 40 which the M-CMTS core uses to communicate with the EQAM components (sometimes referred to as EQAMs), and an M-CMTS reference clock 45 (e.g., a DOCSIS® timing server). M-CMTS reference clock 45 and source reference clocks 25(1 ... P) directly or indirectly synchronize to a common root clock 50. The root clock can be based on any suitable timing source such as GPS satellite signals or signals from other communications devices.

The EQAMs receive incoming information and modulate the information data to proper QAM RF channels to customer sites 15(1 ... L) via an HFC network 55, the final leg of which at the customer site is typically an RF coaxial cable.

A traditional EQAM includes a plurality of modulators 60(1 ... P), each receiving data over IP network 40. Each of modulators 60(1 ... P) has an associated one of a plurality of symbol clock generators 65(1 ... P). The EQAM further includes other components 70 (such as channel multiplexers and DACs). Deriving its timing from M-CMTS reference clock 45, each symbol clock generator generates symbol clocks at which rate the modulator modulates information data into modulated symbols. The symbol clock frequency is typically given in the form of:

$$F_b = F_m * M/N$$

where $F_b$ represents the rate of the symbol clock, $F_m$ represents the rate of the reference clock (e.g., 10.24 MHz), and M/N are the predetermined values depending on the modulation mode and the reference clock. For example, M/N is equal to 78/149 for 256QAM and 401/812 for 64QAM.

The modulator modulates one symbol at each symbol clock generated by the symbol clock generator. In this way, the modulator synchronizes its symbol clock to the reference clock using the M/N divisors. The outputs of the modulator are converted to analog waveforms using the DAC that may operate at a sampling rate of multiple of $F_b$. An alternative method is to multiplex the outputs of several modulators before outputting to a DAC. However, it requires that these modulators not only synchronize to the same reference clock but also have to be the same M/N value in order to multiplex their outputs.

This prior art system is shown, at least in part, to illustrate the nature of a problem that can be addressed by some embodiments of the present invention. As discussed above, the entire network, including source servers 10(1 ... P), M-CMTS core 30, and EQAMs 35(1 ... P) has to directly or indirectly synchronize to common root clock 50.

Even synchronizing to a common root clock, there still exist many EQAM devices with modulators operating at different modulation modes, hence different M/N divisors. While it would be desirable to use a single DAC (hardware or embedded component) for the EQAM, different symbol clocks among the modulators greatly complicate multiplexing the modulators' outputs in order to share the DAC.

As alluded to above, HFC network 55 also carries upstream traffic, and M-CMTS core 30 is shown as having an upstream receiver 75 (only one is shown) in communication with the HFC network. As also mentioned, the invention is concerned with the downstream traffic, not the upstream traffic. Accordingly, details such as the synchronization of DOCSIS® channels between cable modems and the M-CMTS core, and the resynchronization of data by the M-CMTS core when it acts as a data server are not shown or described. As discussed above, they do not form a part of the present invention, and are well understood by those skilled in the art.

First Representative Embodiment

Overview of First Embodiment

In short, embodiments of the present invention recognize and address the problems in a manner that allows the EQAMs to receive and modulate contents from multiple data sources with different timing without loss of synchronization and M/N flexibility. This is accomplished by providing appropriate ones of source reference clocks 25(1 . . . P) to appropriate ones of EQAMs 35(1 . . . P). This will be described in detail below.

Figure 2:
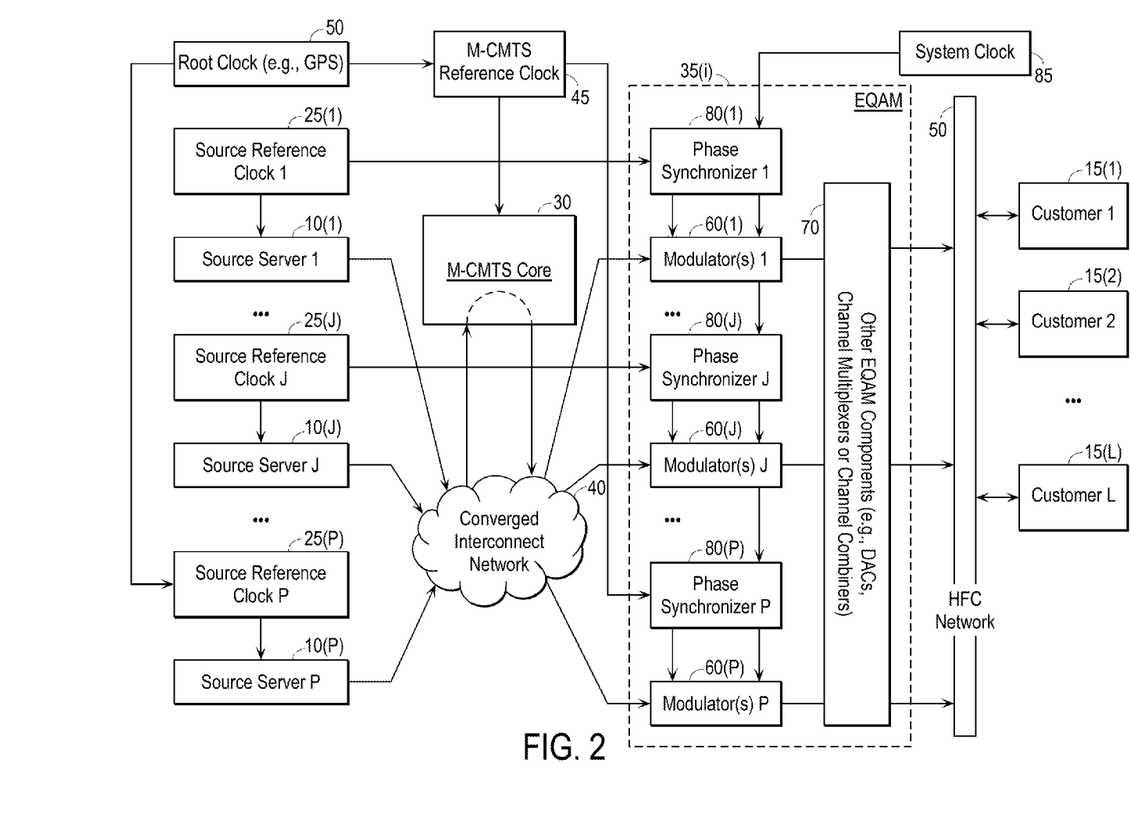
FIG. 2 is a is a block diagram showing an exemplary system according to a first embodiment of the present invention.

FIG. 2 is a system block diagram showing an exemplary system according to a first embodiment of the present invention. In this embodiment, the modulators do not have symbol clock generators. Elements in FIG. 2 that correspond generally to elements shown in FIG. 1 will be shown with the same reference numerals. The figure shows an expanded EQAM 35(*i*) that includes a plurality of modulators 60(1 . . . P), each receiving data over IP network 40 from a respective one of source servers 10(1 . . . P). Each of modulators 60(1 . . . P) has an associated one of a plurality of phase synchronizers 80(1 . . . P).

At one extreme, M-CMTS core 30 is responsible for synchronizing the data from all of source servers 10(1 . . . P), in which case all of phase synchronizers 80(1 . . . P) receive their input timing from M-CMTS reference clock 45. At the other extreme, the M-CMTS core is responsible for none of the data synchronization, in which case all of phase synchronizers 80(1 . . . P) receive their input timing from respective source reference clocks 25(1 . . . P).

For intermediate cases, M-CMTS core 30 is responsible for synchronizing the data from one or more (but not all) of source servers 10(1 . . . P), and one or more of phase synchronizers 80(1 . . . P) receive their input timing from M-CMTS reference clock 45. In such intermediate cases, this leaves the M-CMTS core not responsible for the data synchronization of the remaining one or more source servers, and the remaining one or more phase synchronizers 80(1 . . . P) receive their input timing from the remaining one or more of respective source reference clocks 25(1 . . . P).

For generality, FIG. 2 shows an intermediate case where phase synchronizers 80(1 . . . J) receive their timing from respective source reference clocks 25(1 . . . J), with $J \geq 1$, and where at least one phase synchronizer 80(P) receives its timing from M-CMTS reference clock 45. That is, the M-CMTS core synchronizes data for some but not all of the data servers, and doesn't synchronize the data for the remaining data servers. However, as mentioned above, this first embodiment contemplates the extreme case where all the phase synchronizers receive their timing from respective source reference clocks. This would be the case where J=P.

A local system clock 85 provides clock signals for modulators 60(1 . . . P) and phase synchronizers 80(1 . . . P) to operate. While it is preferred to have the system clock generated locally, there is no prohibition on its being derived from an external clock such as one based on GPS satellite signals or on signals from other communications devices. However, there is no assumption of, or reliance on, the system clock being synchronized with any of source reference clocks 25(1 . . . P) or with M-CMTS reference clock 45.

Instead of outputting symbols at the symbol clock frequency, the modulator outputs fractional symbols at the system clock frequency, or at a submultiple thereof. The phase synchronizers 80(1 . . . P) generate fractional symbol phases off the system clock. The structure and operations of the phase synchronizers will be discussed in detail below in connection with FIG. 3.

In short, for each system clock, the modulator outputs a sample with the symbol phase given from the phase synchronizer. When the symbol phases are accumulated to over a boundary of $2\pi$, the modulators move to next data. By operating at the same local system clock, the outputs of the modulators within the EQAM can be multiplexed by a channel multiplexer that also operates off the same system clock. Therefore, more than one modulator (or even all the modulators) in an EQAM device can share a DAC.

Each phase synchronizer receives a source reference clock that provides a timing service to maintain a consistent timing and frequency reference between the source server and its modulator, as well as to mitigate the propagation delay differences of these two components. Note that two phase synchronizers may output different symbol phases even they receive the same reference clock because of different M/N divisors.

As discussed above, the inputs to the phase synchronizers need not come only from source reference clocks 25(1 . . . P), although they could. For example, they can come from M-CMTS reference clocks, or even local clocks. The former is shown schematically in FIG. 2, which shows that source server 10(P) having an associated source reference clock 25(P), and a modulator 60(P) that receives data from source server 10(P).

However, in this instance, source server 10(P)'s data is synchronized by the M-CMTS, so source reference clock 25(P) is not communicated to the EQAM. Rather, modulator 60(P)'s associated phase synchronizer 80(P) receives M-CMTS reference clock 45. Another variant is that one or more source servers could use M-CMTS reference clock 45 rather than having separate reference clocks. Since modulator 60(P) is synchronized to M-CMTS core 30, this modulator could also be used in connection with transmitting timing messages to CMs at customer sites 15(1 . . . L) over DOCSIS® downstream channels.

Since the source reference clocks are associated with respective source servers, the modulator associated with a given phase synchronizer is receiving data from the source server associated with that source's reference clock. Put another way, although the drawing doesn't show this explicitly, for a given value k, modulator 60(*k*) receives data from source server 10(*k*) while phase synchronizer 80(*k*) receives timing signals from source reference clock 25(*k*). By providing phase synchronizers 80(1 . . . P) and system clock 85, and by providing signals from source reference clocks 25(1 . . . P), embodiments of the present invention reduce the need to provide synchronization among all the data sources, M-CMTS core 30, and the EQAMs.

The number of source servers 10(1 . . . P) is not subject to any specific constraint, although it is contemplated that in some embodiments, the plurality of source servers may be capable of providing scores to hundreds of content channels, with a given source server providing up to 128 content channels. In some embodiments, modulators 60(1 . . . P) and phase synchronizers 80(1 . . . P) are implemented on one or more integrated circuit chips, with two or more phase synchronizers and modulators on a single chip.

While modulators 60(1 . . . P) are drawn as discrete blocks, in some embodiments, a single hardware device can provide multiple logical devices. For example, two logical modulators could be provided in a time-division multiplexed scheme where the same hardware element is used as one source server's modulator in one set of time slots and as another source server's modulator in an interleaved set of time slots. As another example, the two logical modulators could be the result of the same hardware element operating in distinct different modes in different time slots.

Additionally, each modulator block is provided with the label "Modulator(s)." This is a different issue than that discussed above. A single phase synchronizer 80(k) could be used to service multiple modulators, all receiving data from the same source server 10(k), and thus all in need of synchronization to the same source reference clock 25(k). In the discussion that follows, the set of modulators associated with a particular phase synchronizer will often be referred to simply as a modulator.

The system clock is typically significantly faster than source reference clocks 25(1 . . . P), say be a factor of 30 or greater. In a specific embodiment, the system clock runs at 384 MHz while the source reference clocks run at 10.24 MHz. The system clock is preferably used for all the digital operations in the EQAM device. Such operations include, for example, sampling incoming data signals and generating the modulators' symbol phases. Using one system clock reduces the hardware complexity since the plurality of logical modulators not only can share one hardware resource, but also can be multiplexed and use one DAC, while the phase synchronizers control the different symbol phases.

Additional Details of First Embodiment

Figure 3:
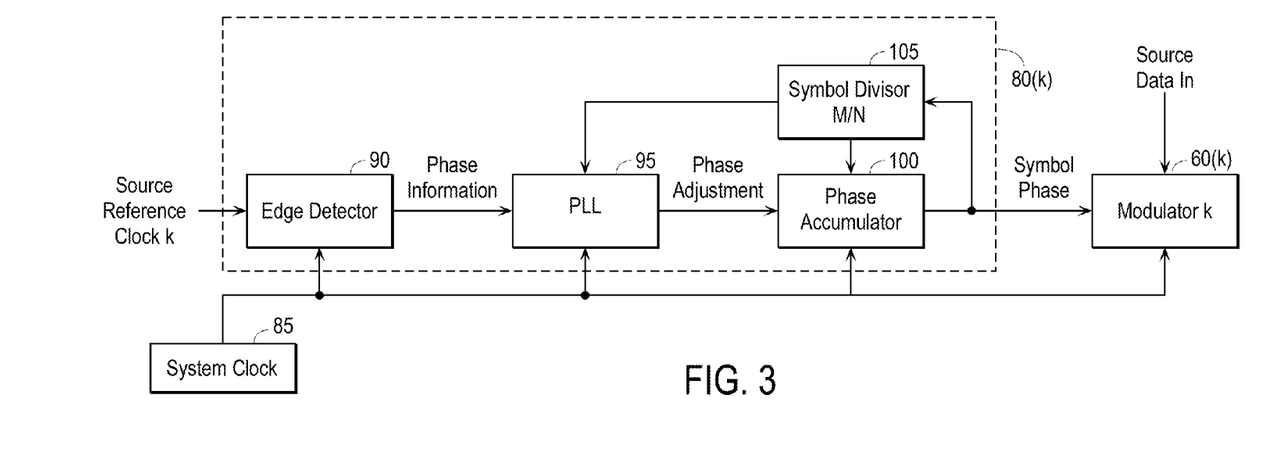
FIG. 3 is an expanded view showing one of modulators and additional details of the modulator's associated phase synchronizer in the first embodiment.

FIG. 3 is an expanded view showing additional details of one of the phase synchronizers in the first embodiment, say phase synchronizer 80(k), which is associated with modulator 60(k). Phase synchronizer 80(k) includes an edge detector 90, a phase-locked loop ("PLL") 95, and a phase accumulator 100. According to this first embodiment, system clock 85 is communicated to each of edge detector 90, phase-locked loop ("PLL") 95, accumulator 100, and modulator 60(k). The phase accumulator is shown as being configured by an associated symbol divisor (M/N) 105.

In some implementations, edge detector 90, phase-locked loop ("PLL") 95, and modulator 60(k) all operate at the system clock frequency. In other implementations, the edge detector 90 operates at the system clock frequency, but phase-locked loop ("PLL") 95 and modulator 60(k) operate at a lower clock frequency (e.g., the system clock divided by an integer).

Edge detector 90 uses the rising edges or falling edges, or both edges, of system clock 85 to sample edge transitions of source reference clocks 25(k), and communicates phase information to PLL 95. The edge transitions of source reference clocks are referred to their levels from low to high, or vice versa. If both edges of the system clock are used to sample the reference clock's phase, the edge detection has an accuracy of half of a system clock period.

The symbol phase from phase accumulator 100 is output to modulator 60(k), and is also M/N-adjusted by symbol divisor 105 and fed back to phase PLL 95 and phase accumulator 100. Based on the difference between edge detector 90's output and phase accumulator 100's output, the PLL provides phase adjustment to the symbol phase of modulator 60(k). In this way, the circuit works based on system clock 85, but modulator 60(k) outputs modulated symbols according to the adjusted symbol phase with the symbols synchronized to its respective source reference clock 25(k). Based on the disclosure and teachings provided herein, a person of ordinary skill in the art would know and appreciate how to design the PLL.

As mentioned above, in this embodiment, there is no separate symbol clock generator; but rather modulator 60(k) outputs fractional symbols at the system clock frequency, or at a submultiple thereof. At each system clock, the modulator adjusts the symbol phase (symphase), which is provided by phase accumulator 100, and generates one output. For example, the output (partial symbol) is y(t)=F(s(t)), where F is a pulse-shaping filter (e.g., a poly-phase filter), y(t) is the output sampling at the system clock, and s(t) is the QAM symbols at the symbol rate. A person of ordinary skill in the art would know how to implement the pulse-shaping filter and its phase.

Figure 4:
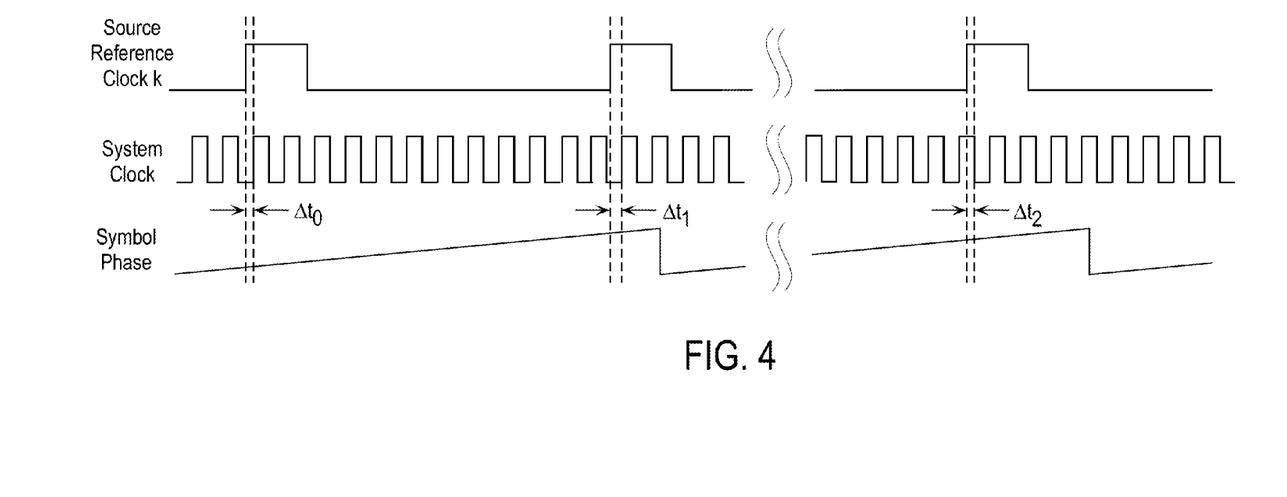
FIG. 4 is a timing diagram showing how the circuitry of FIG. 3 operates to synchronize the modulator's symbol phases to a source reference clock.

FIG. 4 is a timing diagram showing how the circuitry of FIG. 3 operates to synchronize the modulator's symbol phases to one of the source reference clocks, say source reference clock 25(k). The figure shows signals from system clock 85 and one of the source reference clocks, say source reference clock 25(k), and the symbol phase from phase accumulator 100. The operation of the phase synchronizer and modulator of FIG. 3 will be described with reference to the timing diagram of FIG. 4.

In the particular case shown in FIG. 4, edge detector 90 detects the rising edge of source reference clock 25(k) and gets phase information regarding source reference clock 25(k). PLL 95 determines an error based on the phase difference between source reference clock 25(k) and the symbol phase output by phase accumulator 100. In a specific implementation, the edge detector provides the timing difference from an edge of the source reference clock relative to the next edge of the system clock using both rising edges and falling edges of the system clock (i.e., at twice the system clock frequency).

This can in some sense be thought of as sampling phase of the source reference clock at twice the system clock frequency. Sampling the source reference clock, on the other hand, would provide a version of the source reference clock with its rising and falling edges aligned to the edges of the system clock.

The timing diagram shows timing errors designated $\Delta t_0$ and $\Delta t_1$ of the rising edges of the source reference clock sampled by the edge detector at the rising edges of the system clock. The diagram also shows timing error $\Delta t_2$ of the rising edge of the source reference clock sampled at the falling edge of the system clock. The timing errors are the differences between the actual time of the rising edge of the reference clock and the time of the following rising or falling edge of the system clock.

PLL 95 uses the output of edge detector 90 and phase accumulator 100 to generate phase adjustments that keep the phase errors between symbol clock and the source reference clock no more than half the system clock period. The symbol phases are accumulated and wrapped around at $2\pi$ for a rate proportional to the symbol period. The accumulated phases are sampled and phase errors are produced at the event of a rising edge of the reference clock. The PLL adjusts the accumulation rate.

Second Representative Embodiment

Overview of Second Embodiment

Figure 5:
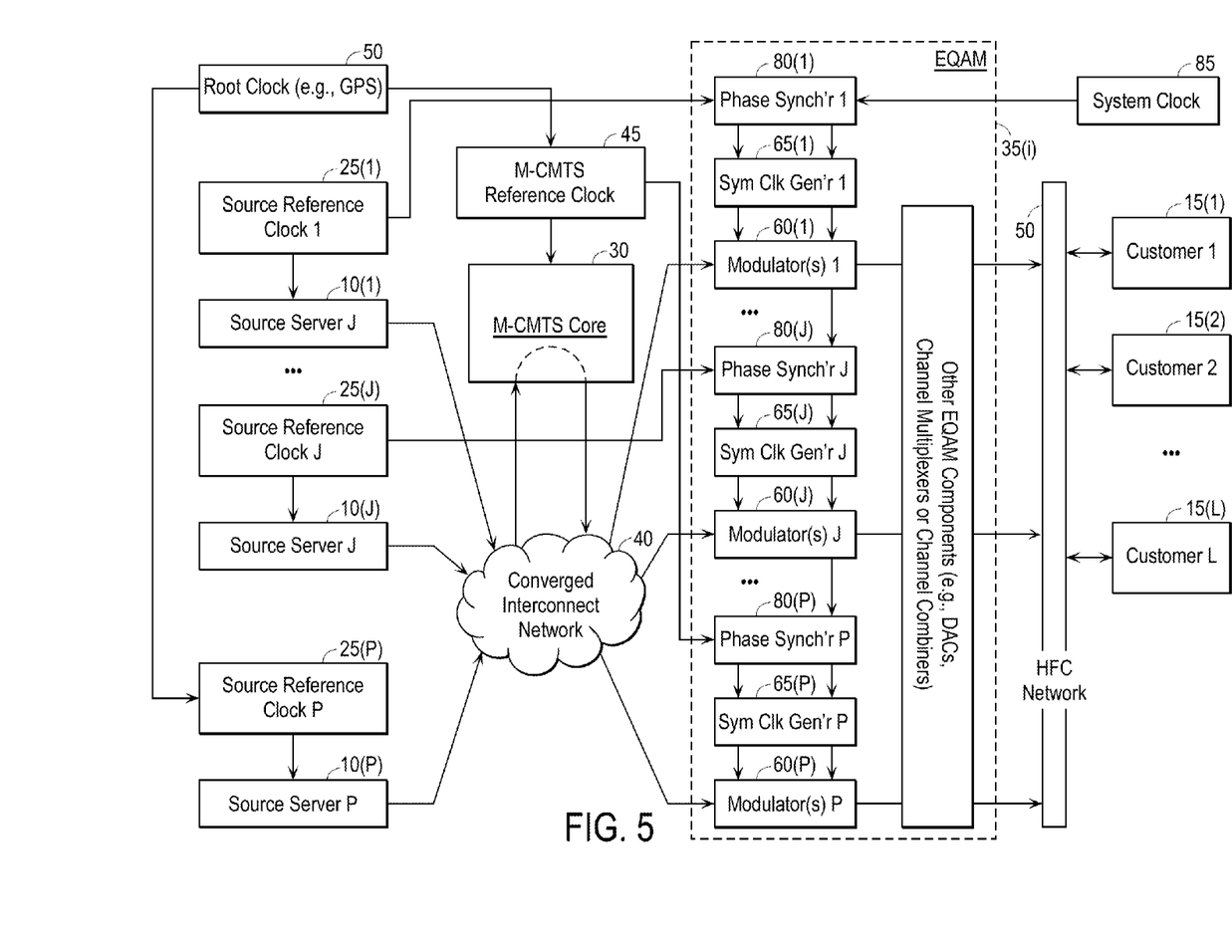
FIG. 5 is a block diagram showing an exemplary system according to a second embodiment of the present invention.

FIG. 5 is a system block diagram showing an exemplary system according to a second embodiment of the present invention. The figure shows an expanded EQAM 35(i) that includes a plurality of modulators 60(1 . . . P), each receiving data over IP network 40. This embodiment differs from the embodiment shown in FIG. 2 in that each of modulators 60(1 . . . P) has an associated one of a plurality of symbol clock generators 65(1 . . . P) in addition to an associated one of a plurality of phase synchronizers 80(1 . . . P). As in the case of the embodiment of FIG. 2, one or more phase synchronizers 80(1 . . . J) receive their timing from respective one or more source reference clocks 25(1 . . . J) and one or more phase synchronizers can receive their timing from M-CMTS reference clock 45.

Other than the fact that symbol clock generators 65(1 . . . P) are interposed between phase synchronizers 80(1 . . . P) and modulators 60(1 . . . P), FIG. 5 contains substantially all the elements shown in FIG. 2, and the same general comments with respect to the number of source servers and characteristics of system clock 85 apply. Also, what is being shown here is that the M-CMTS core can still provides some of the data synchronization (i.e., for source server 10(P), while the phase synchronizers in the EQAM have taken over the synchronization for source servers 10(1 . . . J). Further, as above, the system clock is preferably used for all the digital operations in the EQAM device. Such operations include, for example, sampling incoming data signals and generating the modulators' symbol clocks. Using one system clock reduces the hardware complexity since the plurality of logical modulators can share one hardware resource, while the phase synchronizers control the phases of the different symbol clocks.

Additional Details of Second Embodiment

Figure 6:
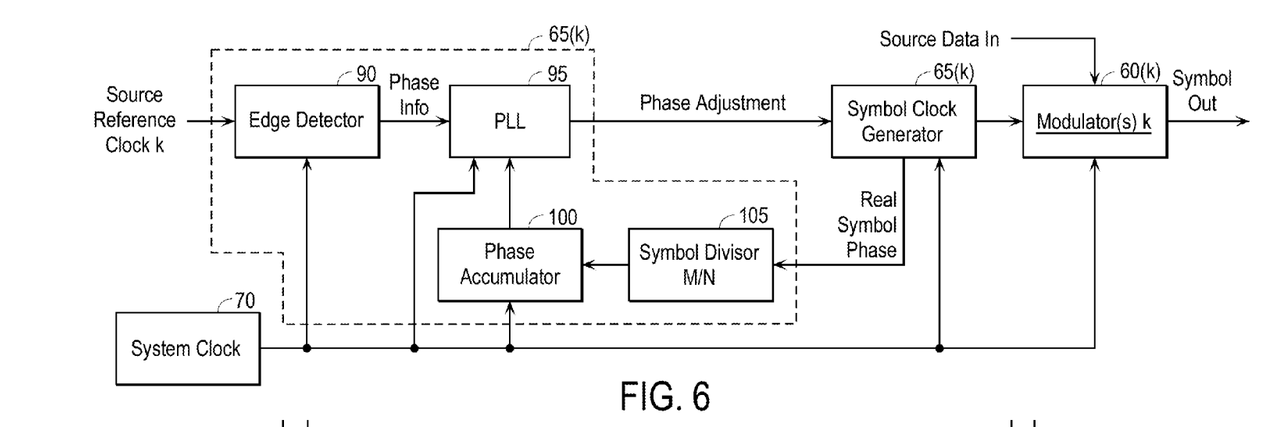
FIG. 6 is an expanded view showing one of modulators and additional details of the modulator's associated phase synchronizer in the second embodiment.

FIG. 6 is an expanded view showing additional details of one of the phase synchronizers in the second embodiment, say phase synchronizer 80(k), which is associated with modulator 60(k). As in the first embodiment, phase synchronizer 80(k) includes edge detector 90, phase-locked loop ("PLL") 95, and phase accumulator 100, but configured somewhat differently in view of the fact that the phase synchronizers in this embodiment control symbol clock generator 65(k). According to this second embodiment, system clock 85 is communicated to each of edge detector 90, phase-locked loop ("PLL") 95, accumulator 100, symbol clock generator 65(k), and modulator 60(k).

Edge detector 90 uses the rising edges or falling edges, or both edges, of system clock 85 to sample the phase of source reference clock 25(k), and communicates phase information to PLL 95. If both edges of the system clock are used to sample the reference clock's phase, the edge detection has an accuracy of half of a system clock period. Based on the difference between edge detector 90's output and phase accumulator 100's output, the PLL provides phase adjustment to symbol clock generator 65(k). Modulator 60(k), when phased with the symbol clock, outputs the modulated symbols according to the adjusted symbol clock.

Symbol clock generator 65(k)'s symbol phase is fed back to phase accumulator 100, whose output is communicated to PLL 95. In this way, the circuit works based on system clock 85, but modulator 60(k) outputs symbols synchronized to its respective source reference clock 25(k). Based on the disclosure and teachings provided herein, a person of ordinary skill in the art would know and appreciate how to design the PLL.

Figure 7:
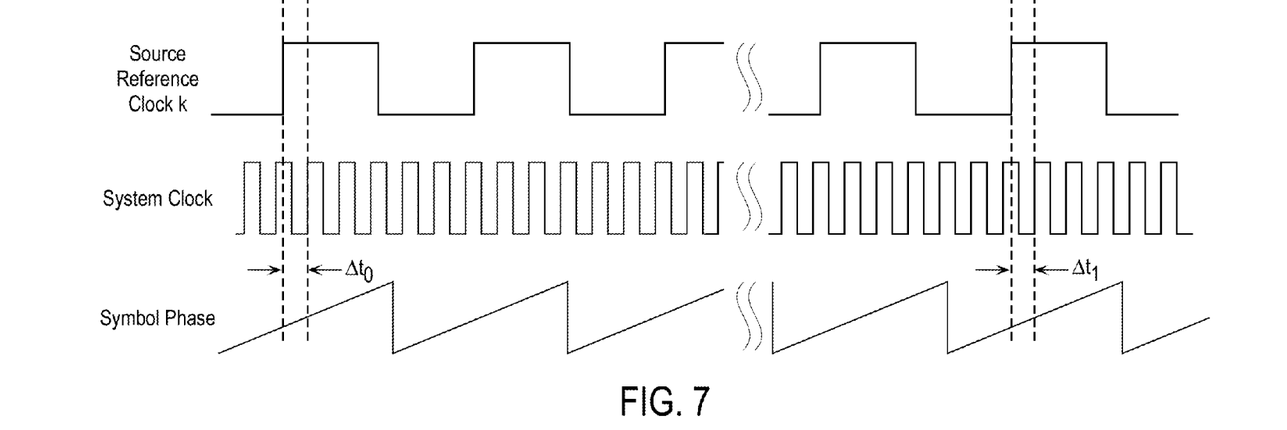
FIG. 7 is a timing diagram showing how the circuitry of FIG. 6 operates to synchronize the modulator's symbol clock to a source reference clock.

FIG. 7 is a timing diagram showing signals from system clock 85 and one of the source reference clocks, say source reference clock 25(k), and the phase of the associated symbol clock from symbol clock generator 65(k). The operation of the phase synchronizer and modulator of FIG. 6 will be described with reference to the timing diagram of FIG. 7. In the particular case shown in FIG. 7, edge detector 90 detects the rising edge or falling edge (or both edges) of source reference clock 25(k) and gets phase information regarding source reference clock 25(k).

PLL 95 determines an error based on the phase difference between source reference clock 25(k) and the symbol clock, where the phase of the symbol clock can be calculated from the output of phase accumulator 100. In another specific implementation, the edge detector samples the rising edge of the source reference clock using both rising edges and falling edges of the system clock (i.e., at twice the system clock frequency).

The timing diagram shows timing errors designated $\Delta t_0$ and $\Delta t_1$ at different rising edges of the source reference clock. In the first embodiment, the timing errors were determined as differences between the actual time of the rising edge of the reference clock and time of the following rising or falling edge of the system clock. Although the particular differences shown in FIG. 7 are shown as the differences between the actual time of the rising edge of the reference clock and time of the following rising edge of the system clock, the timing could be on the basis of rising and/or falling edges.

PLL 95 uses the outputs of edge detector 90 and phase accumulator 100 to generate phase adjustments that keep the phase errors between symbol clock generator 65(k) and source reference clock 25(k) no more than half the system clock period (if both edges of the system clock are used, or no more than the system clock period if only one edge is used). The symbol phases are accumulated and wrapped around at $2\pi$ for a rate proportional to the symbol period. The accumulated phases are sampled and phase errors are produced at the event of a rising edge of the reference clock aligned at the system clock. The PLL adjusts the accumulation rate.

Third Representative Embodiment

Figure 8:
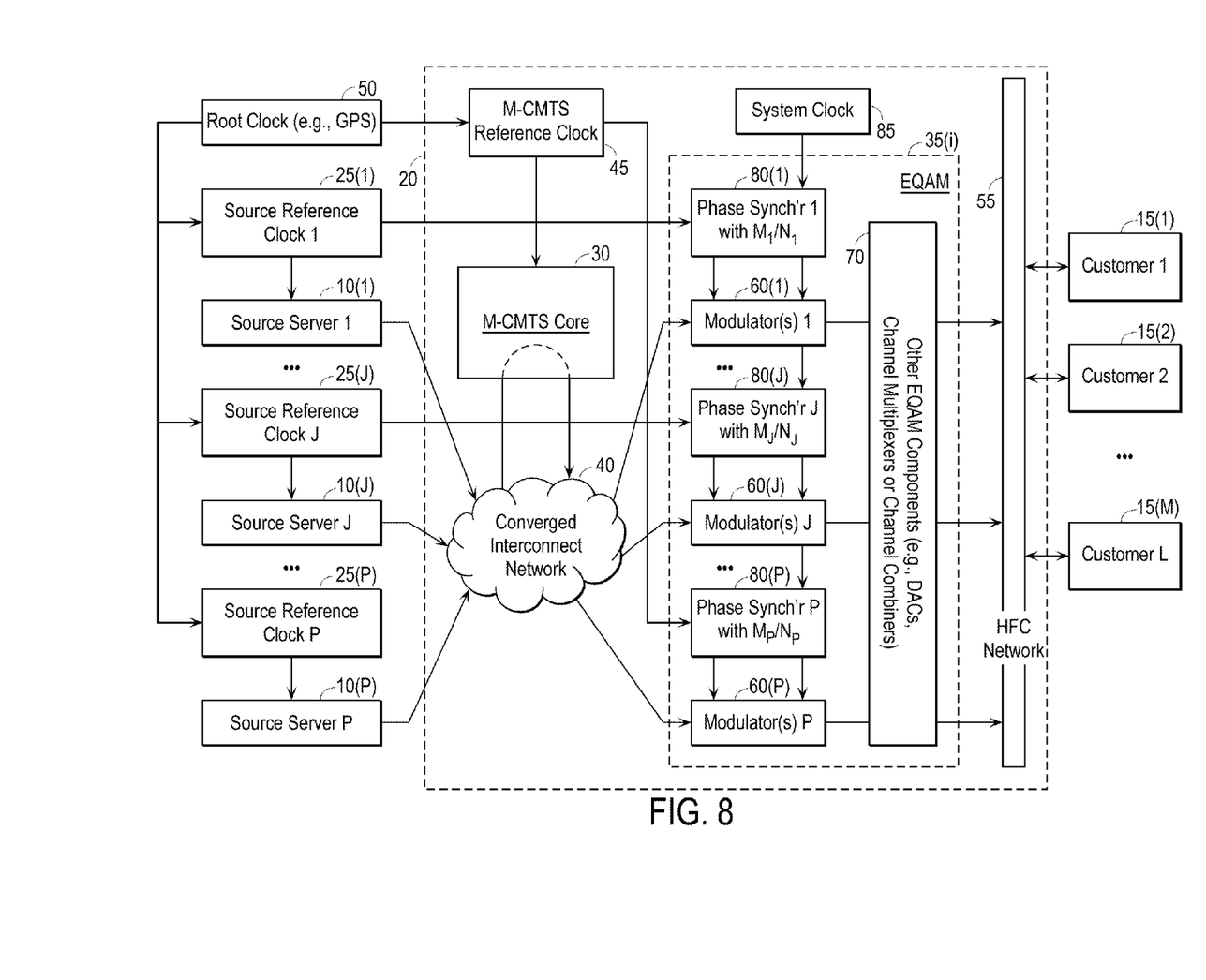
FIG. 8 is a block diagram showing an exemplary system according to a third embodiment of the present invention.

FIG. 8 is a block diagram showing an exemplary system according to a third embodiment of the present invention. This embodiment provides for multiplexing QAM channels, where different channels can use different multiplexing regimes. For example, different QAM modulation schemes use different M/N ratios. In this embodiment, each channel modulates symbols using its respective ratio of the symbol clock rate to the reference clock rate, and the ratios can be different for at least some of the channels.

This embodiment can be used as an enhancement of the prior art system shown in FIG. 1, the first embodiment shown in FIGS. 2-4, or the second embodiment shown in FIGS. 5-7. Elements in FIG. 8 that correspond generally to elements shown in FIGS. 1-3 and FIGS. 5-6 will be shown with the same reference numerals. FIG. 8 shows an expanded EQAM 35(i) that includes a plurality of modulators 60(1 . . . P), each receiving data over IP network 40 from a respective one of source servers 10(1 . . . P). Each of modulators 60(1 . . . P) has an associated one of a plurality of phase synchronizers 80(1 . . . P). As in the first and second embodiments, the system includes system clock 85, and each of the phase synchronizers synchronizes the symbol phases to the system clock, regardless of the timing source that is input to the phase synchronizer.

For generality, FIG. 8 shows an intermediate case where phase synchronizers 80(1 . . . J) receive their timing from respective source reference clocks 25(1 . . . J), with $J \geq 1$, and where at least one phase synchronizer 80(P) receives its timing from M-CMTS reference clock 45. That is, the M-CMTS core synchronizes data for some but not all of the data servers, and doesn't synchronize the data for the remaining data servers. However, this third embodiment contemplates the extreme case where all the phase synchronizers receive their timing from respective source reference clocks (i.e., J=P) as well as the extreme case where all of the phase synchronizers receive their timing from M-CMTS reference clock 45 (i.e., J=0). Put another way, some, none, or all of phase synchronizers 80(1 . . . P) can receive their timing from M-CMTS reference clock 45, while some, none, or all can receive their timing from source reference clocks 25(1 . . . P).

The ability of the EQAM to provide different QAM modulation is provided by the symbol divisor that is used to configure the modulators. In the first embodiment (FIGS. 2-4), symbol divisor 105 is interposed in the feedback path between the output of phase accumulator 100 and phase PLL 95 and phase accumulator 100. In the second embodiment (FIGS. 5-7), symbol divisor 105 is interposed in the feedback path between symbol clock generator 65(k) and phase accumulator 100. This is shown schematically as the phase synchronizers labeled with their own possibly unique symbol divisors ($M_1/N_1 \ldots M_p/N_p$).

The third embodiment, particularly when deployed in an environment where all the phase synchronizers receive their timing from M-CMTS reference clock 45, can be used with the same network infrastructure as the traditional system shown in FIG. 1. Thus, the flexibility of the system can be upgraded locally at the EQAM without having to make changes to remaining portions of the network.

CONCLUSION

In conclusion, it can be seen that embodiments of the present invention provide elegant techniques for enhancing the scalability of cable head-end infrastructure. The need to add expensive M-CMTS cores to accommodate additional bandwidth can be avoided by configuring EQAMs to accept multiple source reference clocks in accordance with embodiments of the present invention. Further, flexibility of the EQAMs can be achieved, even if a single reference clock (e.g., M-CMTS reference clock 45) is provided to the EQAM.

While the above is a complete description of specific embodiments of the invention, the above description should not be taken as limiting the scope of the invention as defined by the claims.

What is claimed is:

1. An apparatus for use at a cable provider facility, the apparatus comprising:
   first and second modulators receiving data from respective first and second data sources and generating respective first and second symbol streams, the first and second data sources being characterized by respective different first and second source reference clocks;
   an input for receiving a system clock that is independent of said first and second reference clocks and is characterized by a system clock period; and
   first and second phase synchronizers coupled to said first and second modulators, respectively, each phase synchronizer having a source reference clock input, a system clock input, and an output coupled to the modulator;
   said first and second phase synchronizers and said first and second modulators operating in response to said system clock;
   each phase synchronizer responding to signals at its respective source reference clock and system clock inputs to provide symbol phase information to the respective modulator to synchronize the respective modulator to the reference clock while the modulator operates in response to said system clock.

2. The apparatus of claim 1 wherein:
   each phase synchronizer comprises an edge detector, a phase-locked loop (PLL), and a phase accumulator, each of which operates in response to said system clock;
   said edge detector generates, in response to a detected designated edge of the source reference clock, a difference relative to a succeeding designated edge of said system clock, and communicates said difference to the PLL; and
   said PLL and said phase accumulator are connected in a feedback loop and provide information to said modulator.

3. The apparatus of claim 2 wherein:
   said difference is generated by said edge detector based on a particular edge of said system clock that occurs only once every system clock cycle; and
   said difference is restricted to values within one system clock period providing a phase detection accuracy corresponding to said system clock period.

4. The apparatus of claim 2 wherein:
   said difference is generated by said edge detector based on both rising and falling edges of said system clock; and
   said difference is restricted to values within half a system clock period providing a phase detection accuracy corresponding to half said system clock period.

5. The apparatus of claim 1 wherein:
   said modulators receive data at packet-based interfaces; and
   said modulators output said symbol streams on an HFC network.

6. The apparatus of claim 1 wherein:
   each phase synchronizer comprises an edge detector, a phase-locked loop (PLL), and a phase accumulator, each of which operates in response to said system clock;
   said PLL and said phase accumulator are connected in a feedback loop configuration;
   said edge detector generates, in response to detected designated edges of the source reference clock, difference signals relative to succeeding designated edges of said system clock, and communicates said difference signals to said PLL;
   said PLL, in response to said difference signals and to a feedback signal from said phase accumulator, generates phase adjustment signals and communicates said phase adjustment signals to said phase accumulator; and
   said phase accumulator, in response to said phase adjustment signals, generates symbol phase signals and communicates said symbol phase signals to said PLL as said feedback signal, and also communicates said phase adjustment signals to that phase synchronizer's associated modulator.

7. The apparatus of claim 6 wherein:
   said associated modulator is not provided with a separate symbol clock generator; and
   said associated modulator, in response to said symbol phase signals, generates partial symbols and outputs said partial symbols at said system clock frequency.

8. The apparatus of claim 1 wherein each modulator is provided with a separate symbol clock generator.

9. The apparatus of claim 8 wherein:
   each phase synchronizer comprises an edge detector, a phase-locked loop (PLL), and a phase accumulator, each of which operates in response to said system clock;
   said PLL and said phase accumulator are connected in a feedback loop configuration;
   said edge detector generates, in response to detected designated edges of the source reference clock, difference signals relative to succeeding designated edges of said system clock, and communicates said difference signals to the PLL;
   said PLL, in response to said difference signals and to a feedback signal from said phase accumulator, generates phase adjustment signals and communicates said phase adjustment signals to the symbol clock generator associated with that phase synchronizer's associated modulator;

the symbol clock generator generates a symbol clock signal that is communicated to said associated modulator, and further communicates symbol phase signals to said phase accumulator; and said phase accumulator, in response to said symbol phase signals, generates said feedback signal, and communicates said feedback signal to said PLL.

10. An apparatus for use at a cable provider facility, the apparatus comprising:
first and second modulators receiving data from respective first and second data sources and generating respective first and second symbol streams, the first and second data sources being characterized by respective different first and second source reference clocks;
an input for receiving a system clock that is independent of said first and second reference clocks; and
first and second phase synchronizers coupled to said first and second modulators, respectively, each phase synchronizer having a source reference clock input, a system clock input, and an output coupled to the modulator;
wherein:
said modulators and phase synchronizers operate in response to said system clock;
each phase synchronizer responds to signals at its respective source reference clock and system clock inputs to provide a control signal to the respective modulator on the phase synchronizer's output to synchronize the respective modulator to the source reference clock while operating in response to said system clock.

11. The apparatus of claim 10 wherein:
each phase synchronizer comprises an edge detector, a phase-locked loop (PLL), and a phase accumulator, each of which operates in response to said system clock;
said edge detector uses the system clock and the source reference clock to generate phase information that is communicated to said PLL;
said phase accumulator receives symbol phase information from the respective modulator, and provides output information to said PLL; and
said PLL uses the phase information from said edge detector and the output information from said phase accumulator to generate a phase adjustment control signal to the respective modulator.

12. The apparatus of claim 11 wherein said edge detector uses only rising edges or falling edges of the system clock, thereby providing an edge detection accuracy of a system clock period.

13. The apparatus of claim 11 wherein said edge detector uses both rising edges and falling edges of the system clock, thereby providing an edge detection accuracy of half a system clock period.

14. The apparatus of claim 10 wherein:
said modulators receive data at packet-based interfaces; and
said symbol streams are output on an HFC network.

15. An apparatus for use at a cable provider facility, the apparatus comprising:
first and second modulators receiving data from respective first and second data sources and generating respective first and second symbol streams, the first and second data sources being characterized by respective different first and second source reference clocks, said first and second modulators having respective first and second symbol clock generators;
an input for receiving a system clock that is independent of said first and second reference clocks; and
first and second phase synchronizers coupled to said first and second symbol clock generators, respectively, each phase synchronizer having a source reference clock input, a system clock input, and a feedback input;
wherein:
said first and second phase synchronizers, said first and second symbol clock generators, and said first and second modulators operate in response to said system clock;
each phase synchronizer responds to signals at its respective reference clock, system clock, and feedback inputs to provide a control signal to the respective symbol clock generator to synchronize the respective modulator's symbol clock to the reference clock.

16. The apparatus of claim 15 wherein:
each phase synchronizer comprises an edge detector, a phase-locked loop (PLL), and a phase accumulator;
said edge detector uses the system clock and the source reference clock to generate phase information that is communicated to said PLL;
said phase accumulator receives symbol phase information from the respective modulator's symbol generator, and provides output information to said PLL; and
said PLL uses the phase information from said edge detector and the output information from said phase accumulator to generate a phase adjustment control signal to the respective modulator's symbol clock generator.

17. The apparatus of claim 16 wherein said edge detector uses only rising edges or falling edges of the system clock, thereby providing an edge detection accuracy of a system clock period.

18. The apparatus of claim 16 wherein said edge detector uses both rising edges and falling edges of the system clock at twice the system clock frequency, thereby providing an edge detection accuracy of half a system clock period.

19. The apparatus of claim 15 wherein:
said modulators receive data at packet-based interfaces; and
said symbol streams are output on an HFC network.

20. A method of modulating data at a cable provider facility, the method comprising:
providing a plurality of modulators with a corresponding plurality of phase synchronizers at the facility;
providing a system clock at the facility;
receiving, at respective packet-based interfaces of the modulators, data from respective ones of a corresponding plurality of remote data sources;
receiving, at respective reference clock inputs of the phase synchronizers, source reference clocks from respective ones of a corresponding plurality of remote reference clocks associated with the plurality of remote data sources, at least two of the reference clocks being different from each other;
receiving, at respective system clock inputs of the phase synchronizers, the system clock;
in response to signals at the respective reference clock input and system clock input of the phase synchronizers, generating control signals for the respective modulators, the control signals operating to synchronize the modulators to the respective source reference clocks; and
at the modulators, so synchronized, modulating the data received at the respective packet-based interfaces.

21. A method of modulating data at a cable provider facility, the method comprising:
providing a plurality of modulators with a corresponding plurality of phase synchronizers at the facility;

providing a system clock at the facility;
receiving packet-based data from respective ones of a corresponding plurality of remote data sources;
receiving, at respective reference clock inputs of the phase synchronizers, reference clocks from respective ones of a corresponding plurality of remote reference clocks associated with the plurality of remote data sources, at least two of the reference clocks being different from each other;
receiving, at respective system clock inputs of the phase synchronizers, the system clock;
in response to signals at the respective reference clock inputs, signals at the respective system clock inputs, and feedback signals, generating control signals for the respective modulators, the control signals operating to synchronize respective symbol phases for the modulators to the respective reference clocks; and
at the modulators, using the symbol phases, so synchronized, in connection with modulating the packet-based data.

22. A method of modulating data at a cable provider facility, the method comprising:
providing a plurality of modulators with a corresponding plurality of phase synchronizers at the facility;
providing a system clock at the facility;
receiving packet-based data from respective ones of a corresponding plurality of remote data sources;
receiving, at respective reference clock inputs of the phase synchronizers, reference clocks from respective ones of a corresponding plurality of remote reference clocks associated with the plurality of remote data sources, at least two of the reference clocks being different from each other;
receiving, at respective system clock inputs of the phase synchronizers, the system clock;
receiving, at respective feedback inputs of the phase synchronizers, signals from respective symbol clock generators associated with the respective modulators;
in response to signals at the respective reference clock inputs, system clock inputs, and feedback inputs of the phase synchronizers, generating control signals for the respective symbol clock generators, the control signals operating to synchronize the respective symbol clock generators to the respective reference clocks; and
at the modulators, using the symbol clocks, so synchronized, in connection with modulating the packet-based data.

23. An apparatus for use at a cable provider facility, the apparatus comprising:
first and second modulators receiving data from respective first and second data sources and generating respective first and second symbol streams;
first and second phase synchronizers coupled to said first and second modulators, respectively, each phase synchronizer having a reference clock input, a system clock input, and an output coupled to the modulator; and
an input for receiving a system clock that is independent of reference clocks provided to said phase synchronizers' reference clock inputs, said system clock being characterized by a system clock period;
wherein:
said first and second phase synchronizers and said first and second modulators operate in response to said system clock;
each phase synchronizer responds to signals at its respective source reference clock and system clock inputs to provide symbol phase information to the respective modulator to synchronize the respective modulator to the reference clock while the modulator operates in response to said system clock;
each phase synchronizer comprises an edge detector, a phase-locked loop (PLL), and a phase accumulator, each of which operates in response to said system clock;
said edge detector generates, in response to a detected designated edge of the source reference clock, a difference relative to the next succeeding edge of said system clock, including rising and falling edges, so that said difference is restricted to values within half a system clock period, thereby providing a phase detection accuracy corresponding to half said system clock period; and
said edge detector communicates said difference to the PLL, wherein
said PLL and said phase accumulator are connected in a feedback loop and provide information to said modulator.

24. The apparatus of claim 23 wherein said first and second phase synchronizers receive the same reference clock.

25. The apparatus of claim 23 wherein said first and second phase synchronizers receive different reference clocks.

26. An apparatus for use at a cable provider facility, the apparatus comprising:
first and second modulators receiving data from respective first and second data sources and generating respective first and second symbol streams;
first and second phase synchronizers coupled to said first and second modulators, respectively, each phase synchronizer having a reference clock input, a system clock input, and an output coupled to the modulator; and
an input for receiving a system clock that is independent of reference clocks provided to said phase synchronizers' reference clock inputs, said system clock being characterized by a system clock period;
wherein:
said first and second phase synchronizers and said first and second modulators operate in response to said system clock;
each phase synchronizer responds to signals at its respective reference clock and system clock inputs to provide symbol phase information to the respective modulator to synchronize the respective modulator to the reference clock while the modulator operates in response to said system clock;
each phase synchronizer is configured with a symbol divisor characteristic of a modulation mode of its associated modulator; and
said first and second phase synchronizers are configured with different symbol divisors to allow for different modulation modes.

27. The apparatus of claim 26 wherein said first and second phase synchronizers receive the same reference clock.

28. The apparatus of claim 26 wherein said first and second phase synchronizers receive different reference clocks.

* * * * *